United States Patent [19]

Shinagawa et al.

[11] 4,247,953
[45] Jan. 27, 1981

[54] TUNABLE HIGH-FREQUENCY INPUT CIRCUIT

[75] Inventors: Mitsuhisa Shinagawa, Fujisawa; Shigeo Matsuura; Toshinori Murata, both of Yokohama, all of Japan

[73] Assignee: Hitachi, Ltd., Japan

[21] Appl. No.: 920,698

[22] Filed: Jun. 30, 1978

[30] Foreign Application Priority Data

| Jul. 1, 1977 | [JP] | Japan | 52-77936 |
| Jul. 1, 1977 | [JP] | Japan | 52-77937 |
| Jul. 1, 1977 | [JP] | Japan | 52-77938 |

[51] Int. Cl.³ .................. H04B 1/18; H04B 1/26; H03J 5/00
[52] U.S. Cl. .................. 455/191; 334/15; 455/180
[58] Field of Search ........ 325/452, 458, 459, 461–463, 325/489, 490, 379, 383, 385; 334/15; 455/150, 168, 176, 180, 188, 191, 190, 195, 286, 339

[56] References Cited

U.S. PATENT DOCUMENTS

| 3,029,339 | 4/1962 | Pan | 334/15 |
| 3,400,345 | 9/1968 | Oloff | 325/461 |
| 3,500,265 | 3/1970 | Klettke | 334/15 |
| 3,526,859 | 9/1970 | Putzer | 325/462 |
| 3,562,652 | 2/1971 | Von Frange et al. | 325/459 |
| 3,611,154 | 10/1971 | Kupfer | 325/459 |
| 3,624,514 | 11/1971 | Putzer | 325/459 |

Primary Examiner—Marc E. Bookbinder
Attorney, Agent, or Firm—Craig & Antonelli

[57] ABSTRACT

A high-frequency input circuit suitable for use in a television receiver, which includes a tuning circuit which can operate with a reduced loss and can be tuned to signals in, for example, the VHF and UHF bands at the same time. The high-frequency input circuit provides an integrated tuner capable of receiving all the signals within the range from the VHF band to the UHF band.

7 Claims, 11 Drawing Figures

TUNABLE HIGH-FREQUENCY INPUT CIRCUIT

FIELD OF THE INVENTION

This invention relates to a high-frequency input circuit such as that of a television receiver which receives multiband signals, and more particularly to an integrated tuner which can receive all the television signals within the range from the VHF band to the UHF band in spite of the provision of a single channel selector.

A high-frequency input circuit of a receiver is commonly called a tuner. A tuner used in a television receiver comprises generally two separate units, that is, a VHF tuner or a channel selector for the VHF band and a UHF tuner or a channel selector for the UHF band, and elements including a tuning circuit, a high-frequency amplifier circuit, a frequency mixer and a local oscillator are provided in each of these channel selectors. An electronic tuner includes a tuning circuit employing a variable capacitance diode for tuning, and a VHF channel selector and a UHF channel selector in such an electronic tuner include the same tuning circuits, high-frequency amplifier circuits, frequency mixers and local oscillators. Thus, a so-called integrated tuner has been proposed in which the elements including the variable capacitance diode and high-frequency amplifying transistor are used in common to the VHF and UHF channel selectors so that a single unit can receive all the signals within the range from the VHF band to the UHF band.

FIG. 1 is a block diagram of the proposed integrated tuner. Referring to FIG. 1, high-frequency signals applied to an input terminal 1 pass through an input tuning circuit 3, a high-frequency amplifier circuit 6 and an interstage tuning circuit 4, so that a signal of desired channel frequency only can be selected and amplified to be applied to a frequency mixer 7. A signal of local oscillation frequency produced by a tuning oscillator composed of an oscillation transistor 8 and a resonance circuit 5 is also applied to the frequency mixer 7. Thus, the selected and amplified high-frequency signal applied to the frequency mixer 7 is converted into a signal of intermediate frequency and is then delivered from an output terminal 2. Both the interstage tuning circuit 4 and the resonant circuit 5 have a basic circuit structure similar to that shown in the block representing the input tuning circuit 3. The input tuning circuit 3, interstage tuning circuit 4 and resonant circuit 5 having such a basic structure can be tuned to all the signals within the range from the VHF band to the UHF band.

The structure and operation of the input tuning circuit 3 will be described with reference to FIG. 1. This tuning circuit 3 comprises a variable tuning circuit constituted by inductors 9, 10, 11, a capacitor 12 and a variable capacitance diode 13, and a received-band change-over circuit constituted by switching diodes 14, 15 and bypass capacitors 16, 17. A bypass resistor 18 is connected between the cathode of the variable capacitance diode 13 and a terminal 21, and current limiting resistors 19 and 20 are connected to the anode of the switching diodes 15, 14 and terminals 22, 23 respectively for limiting the current supplied to the switching diodes 15 and 14.

A positive DC voltage is supplied to the terminal 23 to turn on the switching diode 14 when a signal in the UHF band is to be received. In response to the turn-on of the switching diode 14, the series circuit of the inductors 10 and 11 is short-circuited with respect to high frequencies, and the inductor 9 can only contribute to the tuning. Consequently, the tuning circuit 3 can be tuned to the highest frequency band, that is, the UHF band.

On the other hand, when a signal in the VHF high-band is to be received, a negative voltage is supplied to the terminal 23 to prevent the switching diode 14 from conducting, and the positive voltage is supplied to another terminal 22 to turn on the switching diode 15. Consequently, the tuning inductance is provided by the series inductance of the inductors 9 and 10, and the tuning circuit 3 can now be tuned to the intermediate frequency band, that is, the VHF high-band.

When a signal in the VHF low-band is to be received, the negative voltage is supplied to both of the terminals 22 and 23 to prevent both of the switching diodes 14 and 15 from conducting. Consequently, the tuning inductance is provided by the series inductance of all the inductors 9, 10 and 11, and the tuning circuit 3 can now be tuned to the lowest frequency band, that is, the VHF low-band.

A variation of the capacitance value of the variable capacitance diode 13 results in a corresponding variation in the resonant frequency of the tuning circuit 3. Therefore, the capacitance value of the variable capacitance diode 13 is varied for selecting a signal in a desired one of the individual bands. For this purpose, a tuning voltage is applied to another terminal 21 connected to the variable capacitance diode 13, and this tuning voltage is varied to vary the capacitance value of the variable capacitance diode 13 thereby varying the resonant frequency.

However, in such a tuning circuit 3, the switching diodes 14 and 15 are connected in series with the tuning inductors 9 and 10 respectively during receiving the signals in the UHF band and VHF high-band. Thus, the Q values of the inductors 9 and 10 are equivalently reduced due to the high-frequency resistance $R_s$ of the switching diodes 14 and 15, resulting in an increased loss of the tuning circuit 3. In the VHF band in which the tuning inductance is relatively large, the influence of this high-frequency resistance $R_s$ is relatively small, and the loss of the tuning circuit 3 is not so appreciable. However, in the UHF band in which the tuning inductance is very small or the order of 10 nH, the influence of this high-frequency resistance $R_s$ is quite large resulting in a great loss of the tuning circuit 3.

It has therefore been a prior art practice to employ independent tuning circuits for the VHF band and UHF band in a tuner as described hereinbefore. Thus, a high-frequency amplifier circuit, a frequency converter and a local oscillator are provided for each of the VHF band and UHF band, and the tuner includes a VHF channel selector and a UHF channel selector.

SUMMARY OF THE INVENTION

It is a primary object of the present invention to provide a tuning circuit capable of operating with a small loss even in, for example, the UHF band, and also to provide an integrated tuner which employs such a tuning circuit so that the elements including the high-frequency amplifier circuit, frequency mixer and local oscillator can be used in common to the tuning of both the VHF band and the UHF band, and all the signals within the range from the VHF low-band to the UHF band can be received in spite of the provision of a single channel selector.

The tuning circuit according to the present invention can be tuned to, for example, signals in both of the VHF band and the UHF band at the same time, and the switching diode for change-over between the VHF band and the UHF band is unnecessary.

The tuning circuit is tuned to two signals at the same time although only one signal is originally required, and the unnecessary signal may provide a source of interference. In the present invention, however, this unnecessary signal is removed by means such as a filter, a change-over switch or a frequency mixer and is not converted into the intermediate frequency signal.

DETAILED DESCRIPTION OF THE PREFERRED EMBODIMENTS

Figure 2:
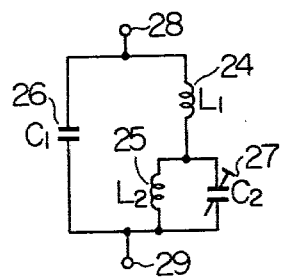
FIG. 2 is a circuit diagram showing the structure of the resonant circuit employed in the present invention to illustrate the operating principle of the tuning circuit according to the present invention.

FIG. 2 shows the structure of the tuning circuit according to the present invention. Referring to FIG. 2, capacitors 26, 27 and inductors 24, 25 constitute a resonant circuit, and another capacitor 27 in the form of a variable capacitance diode is provided for varying the resonant frequency of the resonant circuit. Suppose that the capacitors 26 and 27 have respective capacitances $C_1$ and $C_2$, and the inductors 24 and 25 have respective inductances $L_1$ and $L_2$, then the impedance Z between terminals 28 and 29 is expressed as follows:

$$Z = \cfrac{1}{j\omega C_1 + \cfrac{1}{j\omega L_1 + \cfrac{1}{j\omega C_2 + \cfrac{1}{j\omega L_2}}}} \quad (1)$$

$$= -\frac{j\omega}{C_1} \cdot \frac{\omega^2 - (\omega_{12}^2 + \omega_{22}^2)}{\omega^4 - (\omega_{11}^2 + \omega_{22}^2 + \omega_{12}^2)\omega^2 + \omega_{11}^2\omega_{22}^2}$$

$$= -\frac{j\omega}{C_1} \cdot \frac{\omega^2 - \omega_T^2}{(\omega^2 - \omega_H^2)(\omega^2 - \omega_L^2)}$$

where $$\omega_{11}^2 = \frac{1}{L_1 C_1}, \; \omega_{22}^2 = \frac{1}{L_2 C_2}, \; \omega_{12}^2 = \frac{1}{L_1 C_2} \quad (2)$$

$$\omega_H^2 + \omega_L^2 = \omega_{11}^2 + \omega_{22}^2 + \omega_{12}^2 \quad (3)$$

$$\omega_H^2 \cdot \omega_L^2 = \omega_{11}^2 \cdot \omega_{22}^2 \quad (4)$$

$$\omega_T^2 = \omega_{12}^2 + \omega_{22}^2 \quad (5)$$

The relation among the frequencies $\omega_H$, $\omega_L$ and $\omega_T$ in the equations (3), (4) and (5) can be expressed as follows:

$$\begin{aligned}(\omega_H^2 - \omega_T^2)(\omega_L^2 - \omega_T^2) \\ = \omega_H^2\omega_L^2 - \omega_T^2(\omega_H^2 + \omega_L^2) + \omega_T^4 \\ = -\omega_{11}^2 \cdot \omega_{12}^2 \leq 0 \end{aligned} \quad (6)$$

Therefore, when $\omega_H^2 \geq \omega_L^2$, the following relation holds:

$$\omega_H^2 \geq \omega_T^2 \geq \omega_L^2 \quad (7)$$

That is, the following relation holds:

$$f_H \geq f_T \geq f_L \quad (8)$$

where $\omega_H = 2\pi f_H$, $\omega_T = 2\pi f_T$ and $\omega_L = 2\pi f_L$.

Figure 3:
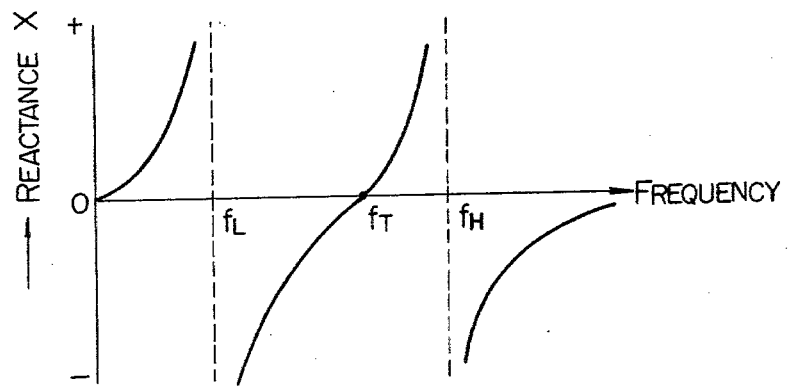
FIG. 3 is a graph showing the operating characteristic of the resonant circuit, in which the vertical axis represents the reactance and the horizontal axis represents the frequency.

The reactance X of the resonant circuit is shown in FIG. 3. It will be seen from FIG. 3 that the resonant circuit resonates at the two frequencies $f_L$ and $f_H$ at the same time. Therefore, when a signal source and a load are connected in parallel with the terminals 28 and 29 shown in FIG. 2, the resonant circuit shown in FIG. 2 provides a tuning circuit which can be tuned to the two frequencies at the same time. Since the two resonant frequencies $f_H$ and $f_L$ are the roots of the quartic equation for $\omega$ when the denominator in the equation (1) is zero, these frequencies $f_H$ and $f_L$ are a function of $\omega_{22}$ and $\omega_{12}$, that is, a function of the capacitance $C_2$ of the capacitor 27. Therefore, the resonant frequencies $f_H$ and $f_L$ of the tuning circuit vary with the variation of the capacitance $C_2$ of the capacitor 27. Thus, when these resonant frequencies $f_H$ and $f_L$ are selected to lie within the range of the UHF band and VHF band, the tuning circuit can be tuned to all of the individual channels in these bands.

Figure 4:
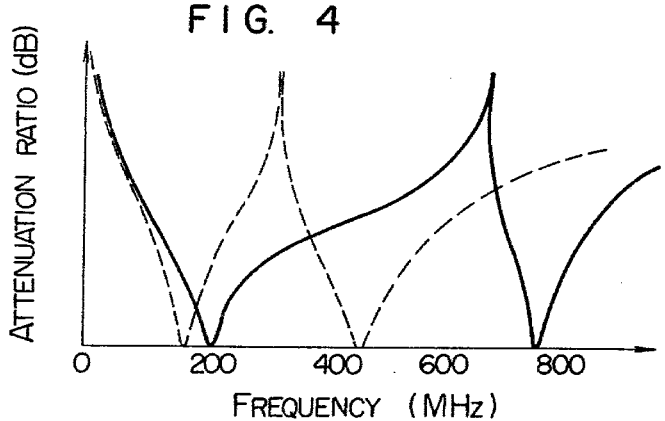
FIG. 4 is a graph showing the selectivity of the tuning circuit, in which the vertical axis represents the attenuation ratio in dB and the horizontal axis represents the frequency in MHz.

FIG. 4 shows the selectivity of the tuning circuit having the signal source and the load connected in parallel with the terminals 28 and 29 of the resonant circuit shown in FIG. 2. This selectivity was measured by varying the capacitance $C_2$ from 2.5 pF to 11.5 pF under the conditions of $L_1 = 34.5$ nH, $L_2 = 48.6$ nH and $C_1 = 5.24$ pF. The tuning circuit is designed to meet the television band standards in Japan, according to which the UHF band ranges from 473 MHz to 767 MHz, and the VHF high-band ranges from 173 MHz to 219 MHz. The characteristic represented by the solid lines was measured at $C_2 = 2.5$ pF, and it will be seen that the resonant frequencies appear in the vicinity of 770 MHz in the UHF band and in the vicinity of 220 MHz in the VHF high-band. The characteristic represented by the broken lines was measured at $C_2 = 11.5$ pF, and it will be seen that the resonant frequencies appear in the vicinity of 470 MHz in the UHF band and in the vicinity of 170 MHz in the VHF high-band. It will thus be seen that the tuning circuit can be tuned to all the channels in the UHF band and VHF high-band according to the standards in Japan when the capacitance $C_2$ of the capacitor 27 is varied from 2.5 pF to 11.5 pF. It is apparent that the capacitance of a variable capacitance diode used in an electronic tuner can be easily varied from 2.5 pF to 11.5 pF. Although the above description has referred to the manner of tuning by varying the capacitance $C_2$ of the capacitor 27, it is needless to say that the tuning circuit can also be tuned to all the channels when the capacitance $C_1$ of the capacitor 26 is varied in lieu of the capacitance $C_2$.

Figure 5:
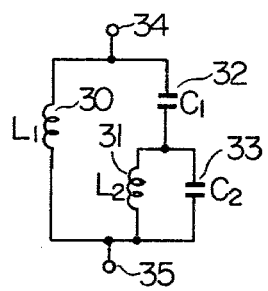
FIGS. 5 and 6 show other forms of the resonant circuit shown in FIG. 2.
Figure 6:
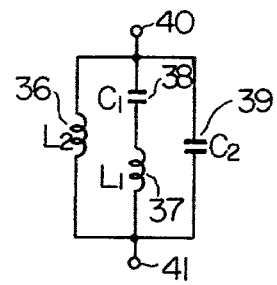

FIGS. 5 and 6 show other resonant circuits having the same function as that of the resonant circuit shown in FIG. 2. These resonant circuits can also be tuned to two frequencies at the same time. An inductor 30 in FIG. 5 and an inductor 37 in FIG. 6 correspond to the inductor 24 in FIG. 2. Another inductor 31 in FIG. 5 and another inductor 36 in FIG. 6 correspond to the inductor 25 in FIG. 2. A capacitor 32 in FIG. 5 and a capacitor 38 in FIG. 6 correspond to the capacitor 26 in FIG. 2. Another capacitor 33 in FIG. 5 and another capacitor 39 in FIG. 6 correspond to the capacitor 27 in FIG. 2. Thus, in the tuning circuits shown in FIGS. 2, 5 and 6, the capacitor having the capacitance $C_1$ and the inductor having the inductance $L_1$ are connected in series with respect to high frequencies, and the capacitor having the capacitance $C_2$ and the inductor having the inductance $L_2$ are connected in parallel with the above series circuit with respect to high frequencies. The resonant frequencies of these tuning circuits can be easily varied by varying the value of the capacitance $C_1$ or $C_2$.

The resonant circuit shown in FIG. 2 can be tuned to frequencies of different bands when another inductor is connected in parallel or in series with the inductor 24 or 25 to vary the inductance $L_1$ or $L_2$ by a switch.

Figure 7:
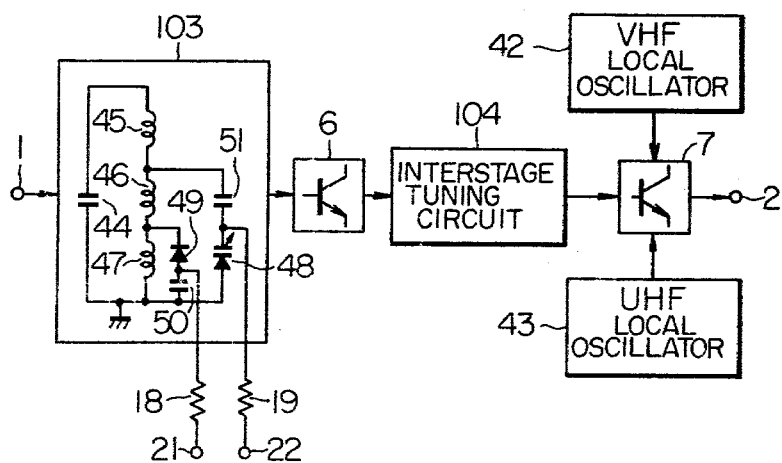
FIG. 7 is a block diagram showing the structure of a first embodiment of the integrated tuner according to the present invention.

FIG. 7 is a block diagram showing the structure of a first embodiment of the integrated tuner according to the present invention in which a tuning circuit as that above described is incorporated. In FIG. 7, like reference numerals are used to denote like parts shown in FIG. 1.

Figure 1:
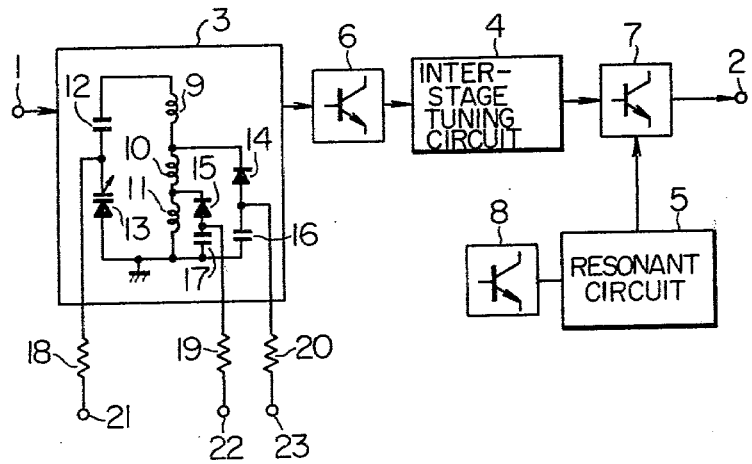
FIG. 1 is a block diagram of an integrated tuner known in the prior art.

Referring to FIG. 7, high-frequency signals in the UHF band and VHF band applied to a high-frequency signal input terminal 1 pass through an input tuning circuit 103, a high-frequency amplifier circuit 6 and an interstage tuning circuit 104, and only one channel is selected in each of the UHF band and VHF band, such signals being amplified to be applied to a frequency mixer 7. One of the selected high-frequency signals applied to the frequency mixer 7 is converted into a signal of intermediate frequency by a signal of local oscillation frequency applied to the frequency mixer 7. This local oscillation frequency signal is applied to the frequency mixer 7 from a VHF local oscillator 42 or a UHF local oscillator 43. The intermediate frequency signal thus obtained is applied to the succeeding stage from an output terminal 2. The local oscillator 42 oscillates only when a channel in the VHF band is to be received, while the local oscillator 43 oscillates only when a channel in the UHF band is to be received. Due to the fact that the tuning circuits 103 and 104 are tuned to one frequency in the VHF band and another frequency in the UHF band, the signals arriving at the frequency mixer 7 include not only a signal in the desired band but also another signal in the other band. Thus, when, for example, a signal of one of the channels in the VHF band is to be received, the tuning circuits 103 and 104 are tuned not only to the desired signal in the VHF band but also to another signal of different frequency in the UHF band, and this UHF signal arrives also at the frequency mixer 7. Therefore, this unnecessary signal must be separated and removed. In the present invention, this desired signal only is converted into the corresponding intermediate frequency signal, while the unnecessary signal is removed as it is not converted into the intermediate frequency signal. That is, the local oscillation frequency signal corresponding to the desired high-frequency signal only is applied to the frequency mixer 7 to convert the desired high-frequency signal only into the intermediate frequency signal. Thus, when the desired signal to be received is a signal in the VHF band, the VHF local oscillator 42 only is permitted to oscillate, while the oscillation of the UHF local oscillator 43 is not permitted, so that the local oscillation frequency signal generated by the VHF local oscillator 42 is only supplied to the frequency mixer 7. On the other hand, when the desired signal to be received is a signal in the UHF band, the UHF local oscillator 43 only is permitted to oscillate, while the oscillation of the VHF local oscillator 42 is not permitted, so that the local oscillation frequency signal generated by the UHF local oscillator 43 is only supplied to the frequency mixer 7. By means of the above arrangement, the high-frequency signal of the desired channel is only converted into the intermediate frequency signal to appear at the output terminal 2. The VHF local oscillator 42 and the UHF local oscillator 43 are shown in FIG. 7. It will be noted however that these two local oscillators are shown for the convenience of the easy understanding of the means employed in the present invention, and a single local oscillator should be shown when a local oscillator capable of generating a local oscillation frequency signal corresponding to a desired signal in the VHF band or UHF band is employed as shown in FIG. 1.

The structure and function of the tuning circuits 103 and 104 employed in the first embodiment shown in FIG. 7 will now be described. The structure and function of the tuning circuit 103 will be described since the tuning circuit 104 is basically the same in structure and function as the tuning circuit 103. In FIG. 7, a capacitor 44 corresponds to the capacitor 26 in FIG. 2, and an inductor 45 corresponds to the inductor 24 in FIG. 2. Also, the series circuit of inductors 46 and 47 corresponds to the inductor 25 in FIG. 2, and a variable capacitance diode 48 corresponds to the capacitor 27 in FIG. 2. In FIG. 7, bypass capacitors 50 and 51 are provided for the DC blocking purpose. A switching diode 49 connected to a terminal 21 through a resistor 18 is connected between the bypass capacitor 50 and the connection point of the inductors 46 and 47. This switching diode 49 serves the purpose of band changeover in the VHF band. A control voltage is supplied to a terminal 22 to be applied through a resistor 19 to the variable capacitance diode 48. The resonant frequencies in the individual bands are varied by this control voltage.

It is preferable that this tuning circuit 103 is tuned to the frequencies in the individual bands principally by one of the following methods:
 (1) The tuning circuit is tuned to the frequencies in the VHF high-band and UHF band when the switching diode 49 conducts, while the tuning circuit is tuned to the frequency in the VHF low-band when the switching diode 49 is cut off.
 (2) The tuning circuit is tuned to the frequencies in the VHF low-band and UHF band when the switching diode 49 is cut off, while the tuning circuit is tuned to the frequency in the VHF high-band when the switching diode 49 conducts.

The first method will be described at first. When a high-frequency signal in the VHF high-band or UHF band is to be received, a positive voltage is supplied to the terminal 21, and the switching diode 49 is turned on to short-circuit the inductor 47. Consequently, the tuning circuit 103 is now composed of the capacitor 44, inductors 45, 46 and variable capacitance diode 48, and the tuning circuit 103 in this state is equivalent to the resonant circuit shown in FIG. 2. The circuit constants are so selected that the tuning circuit 103 can be tuned to the frequencies in the VHF high-band and UHF band. In this state of the tuning circuit 103, the capacitance of the variable capacitance diode 48 is varied by the control voltage supplied to the terminal 22, so that the desired channel in one of these bands can be selected.

When a high-frequency signal in the VHF low-band is to be received, a negative voltage is supplied to the terminal 21 to cut off the switching diode 49. Consequently, the series circuit of inductors 46 and 47 is connected in parallel with the variable capacitance diode 48 to decrease the resonant frequencies of the tuning circuit 103, so that the tuning circuit 103 can now be tuned to the desired frequency in the VHF low-band. The function of the interstage tuning circuit 104 is the same as that of the input tuning circuit 103. In FIG. 7, this tuning circuit 104 is of the single tuned type. If this interstage tuning circuit 104 is to be of the double tuned type, it is composed of two tuning circuits.

The input tuning circuit 103 shown in FIG. 7 is similar to the tuning circuit 3 shown in FIG. 1 in that it includes the switching diode 49 when signals in the UHF band and VHF high-band are received. However, due to the fact that the inductor 46 connected in series with the switching diode 49 has an inductance which is several times as large as that of the inductor 10 in FIG. 1, the loss due to the high-frequency resistance $R_s$ of the variable capacitance diode 49 is not appreciable.

The second method will next be described. When a signal in the VHF low-band or UHF band is to be received, the negative voltage is supplied to the terminal 21 to cut off the switching diode 49. The signals in the VHF low-band and UHF band can both be received by properly selecting the constants of the capacitor 44 and inductors 45, 46 and 47. Desired channels in the individual bands can be selected by varying the capacitance of the variable capacitance diode 48. When a signal in the VHF high-band is to be received, the positive voltage is supplied to the terminal 21 to turn on the switching diode 49 thereby short-circuiting the inductor 47. Consequently, the resonant frequencies of the tuning circuit 104 are increased so that the tuning circuit 103 can now be tuned to the signal in the VHF high-band. Generally, the high-frequency resistance $R_s$ of the switching diode 49 provides an adverse effect to the tuning circuit 103 when a signal in the UHF band is received. However, by virtue of the above means employed in the present invention, such an adverse effect can be obviated since the switching diode 49 is in its cut-off state when the signal in the UHF band is received.

While the above description has referred to two typical methods, there are various other methods. According to one of such methods, for example, signals in the VHF high-band and VHF low-band are simultaneously received. According to another method, the band change-over is effected by the capacitors instead of the inductors. However, the present invention is not directed to such band change-over means, but is directed to a tuning circuit capable of being tuned to signals in two different bands at the same time and also to a tuner incorporating such a tuning circuit. Therefore, the method therefor is not important and should be suitably determined.

Figure 8:
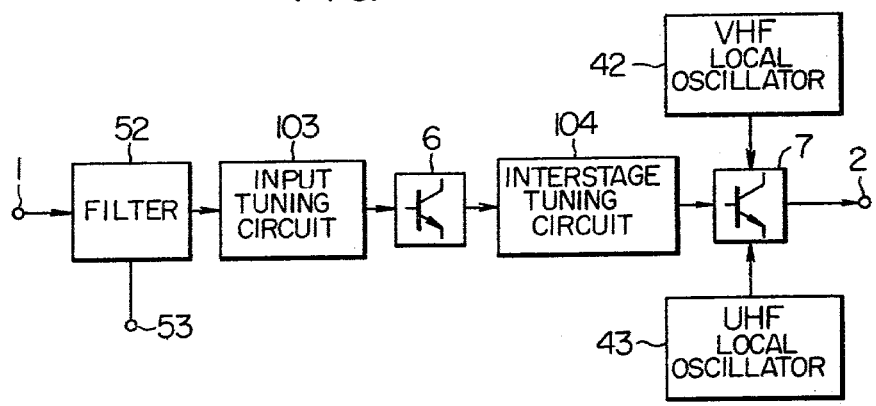
FIG. 8 is a block diagram showing the structure of a second embodiment of the integrated tuner according to the present invention.

FIG. 8 is a block diagram showing the structure of a second embodiment or a modification of the integrated tuner according to the present invention. In the tuner shown in FIG. 7, a desired signal and a non-desired or unnecessary signal arrive at the frequency mixer 7. Thus, when the unnecessary signal has a considerably high level, this unnecessary signal provides a source of interference, and the desired signal may be subjected to cross modulation distortion in the high-frequency amplifier circuit 6 or frequency mixer 7. Further, the unnecessary signal may be undesirably converted into the intermediate frequency signal by a harmonic component of the local oscillation frequency signal. Therefore, this unnecessary signal should be attenuated before it arrives at the frequency mixer 7. To this end, the tuner shown in FIG. 8 includes a filter which can attenuate this unnecessary signal. Referring to FIG. 8, a filter 52 is connected between the high-frequency signal input terminal 1 and the input tuning circuit 103. The input tuning circuit 103, high-frequency amplifier circuit 6, interstage tuning circuit 104, frequency mixer 7, and local oscillators 42 and 43 shown in FIG. 8 are the same as those shown in FIG. 7. The pass band of the filter 52 is changed over by a control signal applied to a terminal 53.

When a signal in the VHF band is to be received, the filter 52 acts as a low-pass filter which permits passage of signals in the VHF band only while not permitting passage of signals in the UHF band. On the other hand, when a signal in the UHF band is to be received, the filter 52 acts as a high-pass filter which permits passage of signals in the UHF band only while not permitting passage of signals in the VHF band. Therefore, the filter 52 in this second embodiment attenuates the unnecessary signal.

There are various forms of such a filter 52 which is capable of changing over the pass band, and one form of this filter 52 will now be described, by way of example.

Figure 9:
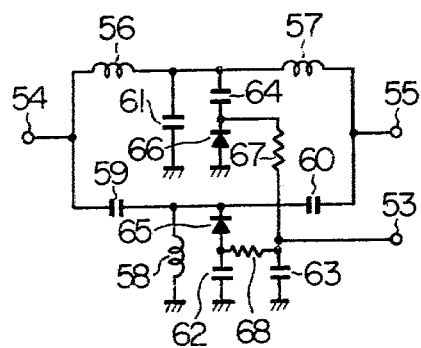
FIG. 9 is a circuit diagram showing the structure of one form of the filter shown in FIG. 8.

FIG. 9 is a circuit diagram showing the structure of a preferred form of the filter 52 employed in the second embodiment of the present invention shown in FIG. 8. Referring to FIG. 9, one of terminals 54 and 55 is an input terminal, and the other is an output terminal. The terminal 53 is the control terminal to which a control voltage is supplied for changing over the characteristic of the filter 52 as described with reference to FIG. 8. Bypass capacitors 62, 63 and 64 are provided to serve the purpose of DC blocking. Bias resistor 68 and 67 limit the current supplied to switching diodes 65 and 66 respectively. The elements 62 to 68 above described have no relation with the characteristic of the filter 52, and the filter characteristic is determined by inductors 56, 57, 58 and capacitors 59, 60, 61.

When a signal in the VHF band is to be received, a positive DC voltage is supplied from the terminal 53 to the switching diodes 65 and 66 through the respective resistors 68 and 67, thereby turning on the switching diode 65 and cutting off the switching diode 66. Consequently, the inductor 58 is short-circuited with respect to high frequencies, and the connection point of the capacitors 59 and 60 is grounded with respect to high frequencies. Therefore, the transmission path between the terminals 54 and 55 provides a low-pass filter in which the inductors 56 and 57 are connected in series with the signal path, and the capacitors 59, 60 and 61 are connected between the signal path and ground. Thus, signals in the VHF band are permitted to pass through the filter 52, while signals in the UHF band are attenuated.

On the other hand, when a signal in the UHF band is to be received, a negative DC voltage is supplied to the terminal 53 to cut off the switching diode 65 and to turn on the switching diode 66. Consequently, the capacitor 61 is short-circuited with respect to high frequencies, and the connection point of the inductors 56 and 57 is grounded. Therefore, to the contrary to the case of reception of a signal in the VHF band, the transmission path between the terminals 54 and 55 provides a high-pass filter in which the capacitors 59 and 60 are connected in series with the signal path, and the inductors 56, 57 and 58 are connected between the signal path and ground. Thus, the filter 52 permits passage of signals in the UHF band while attenuating signals in the VHF band.

In the second embodiment shown in FIG. 8, the filter 52 is shown connected between the high-frequency signal input terminal 1 and the input tuning circuit 103. However, this filter 52 may be connected between the input tuning circuit 103 and the high-frequency amplifier circuit 6, or between the high-frequency amplifier circuit 6 and the interstage tuning circuit 104, or between the interstage tuning circuit 104 and the frequency mixer 7.

Figure 10:
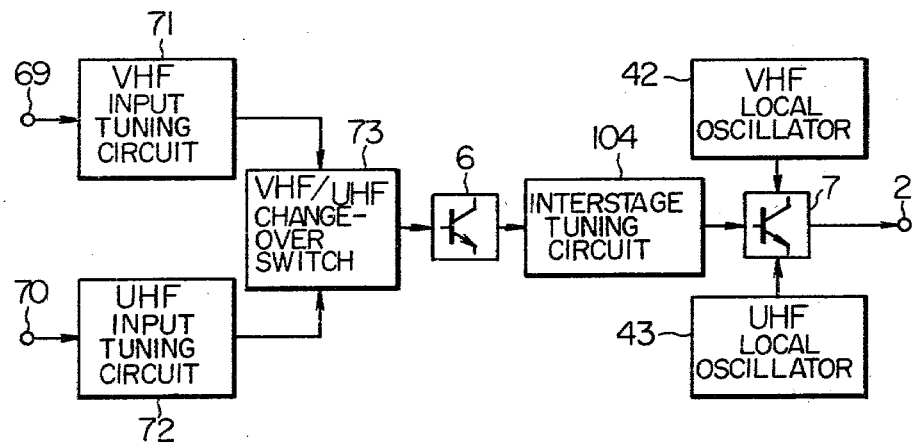
FIG. 10 is a block diagram showing the structure of a third embodiment of the integrated tuner according to the present invention.

A third embodiment of the integrated tuner according to the present invention will be described with reference to FIG. 10. In FIG. 10, like reference numerals are used to denote like parts appearing in FIG. 7.

In this third embodiment, the tuning circuit structure according to the present invention is not applied to input tuning circuits 71 and 72. These input tuning circuits 71 and 72 are a VHF band tuning circuit and a UHF band tuning circuit respectively similar to those employed in a prior art tuner. In response to the application of signals in the VHF band to an input terminal 69, the signal of the required channel only is selected by the input tuning circuit 71 to be applied to a change-over switch 73. Also, in response to the application of signals in the UHF band to an input terminal 70, the signal of the required channel only is selected by the input tuning circuit 72 to be applied to the change-over switch 73. The change-over switch 73 can select either the signal in the VHF band or the signal in the UHF band.

When the signal in the VHF band is required, this signal is selected by the change-over switch 73, while when the signal in the UHF band is required, such a signal is selected. The selected signal of the required channel is then applied to a high-frequency amplifier circuit 6. After being then applied to the tuning circuit 104 as in the first embodiment, this signal is applied to a frequency mixer 7. A local oscillator 42 or 43 applies to the frequency mixer 7 a local oscillation frequency signal corresponding to the required channel, so that an output signal of intermediate frequency corresponding to the required channel appears at an output terminal 2. Since, thus, the signal of the required channel only is applied to the high-frequency amplifier circuit 6, tuning circuit 104 and frequency mixer 7, there is no interference signal which gives rise to troubles including cross modulation distortion.

Figure 11:
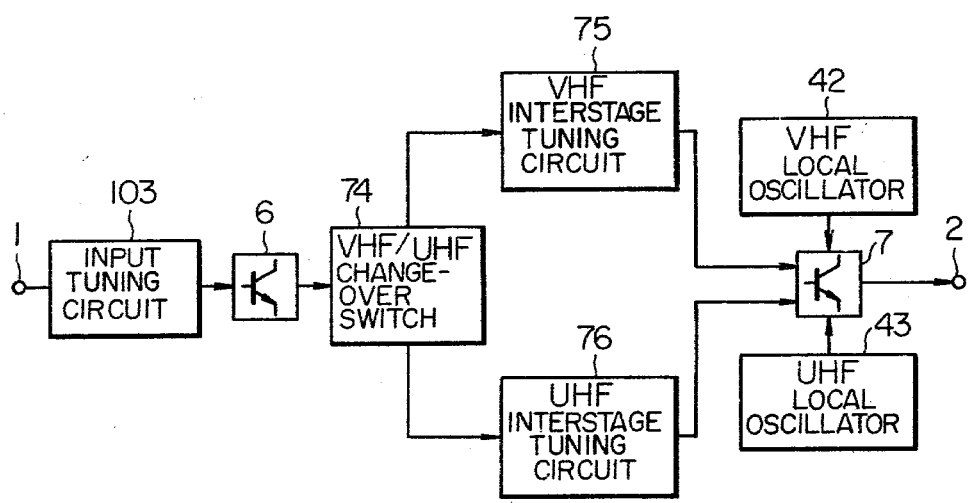
FIG. 11 is a block diagram showing the structure of a fourth embodiment of the integrated tuner according to the present invention.

A fourth embodiment of the integrated tuner according to the present invention will be described with reference to FIG. 11. In FIG. 11, like reference numerals are used to denote like parts appearing in FIG. 7.

In this fourth embodiment, the tuning circuit structure according to the present invention is applied only to an input tuning circuit 103 and is not applied to interstage tuning circuits 75 and 76. These interstage tuning circuits 75 and 76 are conventional ones, and the former is used to handle a signal in the VHF band, while the latter is used to handle a signal in the UHF band. In response to the application of high-frequency signals in the individual bands to a high-frequency signal input terminal 1, the signals of two channels in the two different bands are selected by the input tuning circuit 103 to be applied to a high-frequency amplifier circuit 6, thence, to a change-over circuit 74. These signals of the two channels are then applied to one of interstage tuning circuits 75 and 76. For example, these two signals are applied to the interstage tuning circuit 75 when the signal in the VHF band is required. Since the interstage tuning circuit 75 is tuned only to the signal in the VHF band, the other signal in the UHF band is attenuated, and the signal in the VHF band only is applied to a frequency mixer 7. On the other hand, when the signal in the UHF band is required, the two signals are applied to the interstage tuning circuit 76. Since this interstage tuning circuit 76 is tuned only to the signal in the UHF band, the other signal in the VHF band is attenuated, and the signal in the UHF band only is applied to the frequency mixer 7. A local oscillator 42 or 43 applies to the frequency mixer 7 a local oscillation frequency signal corresponding to the required band, so that an output signal of intermediate frequency corresponding to the required channel appears at an output terminal 2.

In all the embodiments above described, the frequency mixer 7 is used to handle signals in both the VHF band and the UHF band. However, a pair of such frequency mixers may be separately provided for handling signals in the VHF band and UHF band respectively so as to attain more complete separation of the signals in the VHF band and UHF band.

Further, although the present invention has been described with reference to its application to the tuner for television receivers, it is apparent that the tuning circuit according to the present invention is equally effectively applicable to all the tuners handling multi-band signals.

It will be understood from the foregoing detailed description that application of the tuning circuit of the present invention to an integrated tuner can decrease the number of switching diodes and reduce the loss. The elements including the high-frequency amplification element, frequency conversion element and local oscillation element can be used in common for the different band. Thus, a single tuner can receive all the signals within the range, for example, from the VHF band to the UHF band. Therefore, the tuner according to the present invention is inexpensive compared with prior art ones since the number of semiconductor parts and other circuit parts can be greatly decreased.

We claim:

1. A tuning circuit in a high-frequency input circuit of a receiver receiving signals in two or more bands, comprising a first inductor connected at a first terminal thereof to a first terminal of a second inductor, a third inductor connected at a first terminal thereof to a second terminal of said second inductor, a capacitor connected between a second terminal of said first inductor and a second terminal of said third inductor, a first DC-blocking bypass capacitor and a variable capacitance diode connected in series between the first terminal of said first inductor and the second terminal of said third inductor, a second DC-blocking bypass capacitor and a switching diode connected in series between the first and second terminals of said third inductor, means for supplying a voltage to the connection point of said second bypass capacitor and said switching diode through a resistor for turning on said switching diode, and means for supplying another voltage to the connection point of said first bypass capacitor and said variable capacitance diode through another resistor for varying the capacitance value of said variable capacitance diode, whereby the bands to be received are changed over by the on-off of said switching diode, and the resonant frequencies are varied by varying the capacitance value of said variable capacitance diode.

2. A tuning circuit in a high-frequency input circuit of a receiver receiving signals in two or more bands, comprising a first inductor connected at a first terminal thereof to a first terminal of a second inductor, a third inductor connected at a first terminal thereof to a second terminal of said second inductor, a capacitor connected between a second terminal of said first inductor and a second terminal of said third inductor, a first DC-blocking bypass capacitor connected at a first terminal thereof to the first terminal of said first inductor, a variable capacitance diode connected at its cathode to a second terminal of said first DC-blocking bypass capacitor and at its anode to the second terminal of said third inductor, a switching diode connected at its cathode to the first terminal of said third inductor and at its anode to a first terminal of a second DC-blocking bypass capacitor which is connected at its second terminal to the second terminal of said third inductor, means for supplying a voltage to the anode of said switching diode through a resistor for turning on said switching diode so as to change over the bands to be received by the on-off of said switching diode, and means for supplying another voltage to the cathode of said variable capacitance diode through another resistor for varying the capacitance value of said variable capacitance diode so as to vary the resonant frequencies.

3. A tuning circuit as claimed in claim 2, wherein said tuning circuit is tuned to a frequency in the VHF high-band and a frequency in the UHF band at the same time when said switching diode is turned on, while said tuning circuit is tuned at least to a frequency in the VHF low-band when said switching diode is turned off.

4. A tuning circuit as claimed in claim 2, wherein said tuning circuit is tuned to a frequency in the VHF low-band and a frequency in the UHF band when said switching diode is turned off, while said tuning circuit is tuned at least to a frequency in the VHF high-band when said switching diode is turned on.

5. A high-frequency input circuit of a receiver receiving signals in two or more bands, comprising:
(a) a first tuning circuit having received signals input means;
(b) a high-frequency amplifier circuit connected to said first tuning circuit;
(c) a second tuning circuit connected to said high-frequency amplifier circuit;
(d) a local oscillation circuit generating a local oscillation frequency signal corresponding to a received signal;
(e) a frequency mixer connected to said second tuning circuit and said local oscillation circuit for converting the received signal into a signal of intermediate frequency and having intermediate frequency signal output means, wherein each of said first and second tuning circuits comprising a first inductor connected at a first terminal thereof to a first terminal of a second inductor, a third inductor connected at a first terminal thereof to a second terminal of said second inductor, a capacitor connected between a second terminal of said first inductor and a second terminal of said third inductor, a first DC-blocking bypass capacitor and a variable capacitance diode connected in series between the first terminal of said first inductor and the second terminal of said third inductor, a second DC-blocking bypass capacitor and a switching diode connected in series between the first and second terminals of said third inductor, means for supplying a voltage to the connection point of said second bypass capacitor and said switching diode through a resistor for turning on said switching diode, and means for supplying another voltage to the connection point of said first bypass capacitor and said variable capacitance diode through another resistor for varying the capacitance value of said variable capacitance diode, whereby the bands to be received are changed over by the on-off of said switching diode, and the resonant frequencies are varied by varying the capacitance value of said variable capacitance diode.

6. A high-frequency input circuit of a receiver receiving signals in two or more bands comprising:
(a) a filter having received signal input means and including means for changing over the pass band in response to the application of an external voltage;
(b) a first tuning circuit connected to said filter;
(c) a high-frequency amplifier circuit connected to said first tuning circuit;
(d) a second tuning circuit connected to said high-frequency amplifier circuit;
(e) a local oscillation circuit generating a local oscillation frequency signal corresponding to a received signal;
(f) a frequency mixer connected to said second tuning circuit and said local oscillation circuit for converting the received signal into a signal of intermediate frequency and having intermediate frequency signal output means, wherein each of said first and second tuning circuits comprising a first inductor connected at a first terminal thereof to a first terminal of a second inductor, a third inductor connected at a first terminal thereof to a second terminal of said second inductor, a first capacitor connected between a second terminal of said first inductor and a second terminal of said third inductor, a first DC-blocking bypass capacitor and a first variable capacitance diode connected in series between the first terminal of said first inductor and the second terminal of said third inductor, a second DC-blocking bypass capacitor and a second switching diode connected in series between the first and second terminals of said third inductor, means for supplying a voltage to the connection point of said second bypass capacitor and said second switching diode through a resistor for turning on said first switching diode, and means for supplying another voltage to the connection point of said first bypass capacitor and said first variable capacitance diode through another resistor for varying the capacitance value of said first variable capacitance diode, whereby the bands to be received are changed over by the on-off of said switching diode, and the resonant frequencies are varied by varying the capacitance value of said variable capacitance diode.

7. A high-frequency input circuit of a receiver receiving signals in two or more bands, comprising:

(a) a filter having received signal input means and including means for changing over the pass band in response to the application of an external voltage;

(b) a first tuning circuit connected to said filter;

(c) a high-frequency amplifier circuit connected to said first tuning circuit;

(d) a second tuning circuit connected to said high-frequency amplifier circuit;

(e) a local oscillation circuit generating a local oscillation frequency signal corresponding to a received signal;

(f) a frequency mixer connected to said second tuning circuit and said local oscillation circuit for converting the received signal into a signal of intermediate frequency and having intermediate frequency signal output means; and (g) means in said first and second tuning circuits for permitting tuning of said first and second tuning circuits to two frequencies in two different bands at the same time, and wherein said filter comprises a first capacitor and a second capacitor connected in series with respect to high frequencies and also connected to an input terminal and an output terminal respectively, a first inductor and a second inductor connected in series with respect to high frequencies and also connected to said input terminal and said output terminal respectively, a third inductor connected between ground and the connection point of said first and second capacitors, a third capacitor connected between ground and the connection point of said first and second inductors, a first series circuit of a first switching diode and a first DC blocking bypass capacitor connected in parallel with said third inductor, a second series circuit of a second switching diode and a second DC blocking bypass capacitor connected in parallel with said third capacitor, and means for supplying control voltages to said first and second switching diodes for turning on a selected one of said first and second switching diodes.

* * * * *